United States Patent
Yanagi et al.

(10) Patent No.: US 12,382,618 B2
(45) Date of Patent: Aug. 5, 2025

(54) ELECTROMAGNETIC WAVE SHIELDING FILM AND SHIELDED PRINTED WIRING BOARD

(71) Applicant: TATSUTA ELECTRIC WIRE & CABLE CO., LTD., Higashiosaka (JP)

(72) Inventors: Yoshiharu Yanagi, Kyoto (JP); Hiroshi Tajima, Kizugawa (JP); Katsuma Ookura, Kyoto (JP)

(73) Assignee: TATSUTA ELECTRIC WIRE & CABLE CO., LTD., Osaka (JP)

( * ) Notice: Subject to any disclaimer, the term of this patent is extended or adjusted under 35 U.S.C. 154(b) by 2 days.

(21) Appl. No.: 18/694,008

(22) PCT Filed: Sep. 30, 2022

(86) PCT No.: PCT/JP2022/036625
§ 371 (c)(1),
(2) Date: Mar. 21, 2024

(87) PCT Pub. No.: WO2023/054656
PCT Pub. Date: Apr. 6, 2023

(65) Prior Publication Data
US 2024/0431083 A1    Dec. 26, 2024

(30) Foreign Application Priority Data
Sep. 30, 2021   (JP) ................. 2021-161811

(51) Int. Cl.
*H05K 9/00* (2006.01)
*H05K 1/02* (2006.01)

(52) U.S. Cl.
CPC ......... *H05K 9/0088* (2013.01); *H05K 1/0219* (2013.01); *H05K 2201/0715* (2013.01)

(58) Field of Classification Search
CPC ............ H05K 9/0088; H05K 2201/0715
See application file for complete search history.

(56) References Cited

U.S. PATENT DOCUMENTS 10,820,457 B1 * 10/2020 Kishi ............... B32B 15/09
12,120,861 B2 * 10/2024 Yanagi ............. H05K 1/0268
(Continued)

FOREIGN PATENT DOCUMENTS

JP    2000517092    12/2000
JP    2016115725 A    6/2016
(Continued)

OTHER PUBLICATIONS

International Search Report issued in connection with underlying PCT application PCT/JP2022/036625.
(Continued)

*Primary Examiner* — Hung V Ngo
(74) *Attorney, Agent, or Firm* — RANKIN, HILL & CLARK LLP

(57) ABSTRACT

An electromagnetic wave shielding film includes an electroconductive adhesive layer having high peel strength and high connection reliability and suppresses cracks in an insulating layer on the electroconductive adhesive layer. The electromagnetic wave shielding film includes an electroconductive adhesive layer containing electroconductive particles and an adhesive resin composition and an insulating layer on the electroconductive adhesive layer. The electroconductive particles include high melting point electroconductive particles and low melting point electroconductive particles having a lower melting point than the high melting point electroconductive particles, and the high melting point electroconductive particles include high melting point flaky particles and high melting point spherical particles, and the content of the high melting point flaky particles is 60 to 80% by weight of the total content of the high melting point flaky particles, the high melting point spherical particles, and the low melting point electroconductive particles.

9 Claims, 4 Drawing Sheets

(56) References Cited

U.S. PATENT DOCUMENTS

2020/0288608 A1  9/2020  Umeda et al.
2022/0151119 A1  5/2022  Yanagi

FOREIGN PATENT DOCUMENTS

| JP | 2020205442 | 12/2020 |
| WO | 9808362 A1 | 2/1998 |
| WO | 2019073809 A1 | 4/2019 |
| WO | 2020241835 A1 | 12/2020 |

OTHER PUBLICATIONS

Written Opinion issued in connection with underlying PCT application PCT/JP2022/036625.

* cited by examiner

ELECTROMAGNETIC WAVE SHIELDING FILM AND SHIELDED PRINTED WIRING BOARD

TECHNICAL FIELD

The present invention relates to an electromagnetic wave shielding film and a shielded printed wiring board.

BACKGROUND ART

Flexible printed wiring boards have been frequently used to incorporate circuits into complicated mechanisms in mobile equipment such as mobile phones and electronic equipment such as video cameras and notebook computers, which are rapidly progressing in downsizing and functionalization. Moreover, flexible printed wiring boards have also been used to connect movable parts such as printer heads to control units by making use of excellent flexibility thereof. This electronic equipment requires electromagnetic wave shielding measures. Among flexible printed wiring boards to be used in apparatuses, flexible printed wiring boards with electromagnetic wave shielding measures (hereinafter also described as "shielded printed wiring boards") have been increasingly used.

Mobile equipment is required to be multifunctional (equipped with, for example, cameras, GPS functions, and the like). In order to achieve such multifunctionality, the densities of printed wiring boards have been increased. Especially in recent years, electromagnetic wave shielding films are required to have a higher shielding effect to cope with improvement in the performance of mobile equipment based on the 5G communication standard having a communication frequency of as high as 10 GHZ.

When printed wiring boards are highly densely arranged, a method for thinning the thicknesses of the shielded printed wiring boards is adopted due to a limit to the enlargement of mobile equipment itself.

When the thicknesses of the shielded printed wiring boards are thinned, a method for thinning electromagnetic wave shielding films is devised.

However, if the thickness of an electromagnetic wave shielding film is thin, the thermocompression bonding of the electromagnetic wave shielding film to a printed wiring board having a step stretches the electroconductive adhesive layer of the electromagnetic wave shielding film on the step, and may increase its electrical resistance value or damage the electromagnetic wave shielding film itself.

Patent Literature 1 discloses an electromagnetic wave shielding sheet as an electromagnetic wave shielding film (electromagnetic wave shielding sheet) that enables solving such a problem. The electromagnetic wave shielding sheet includes an electrically conductive layer containing flaky electroconductive particulates and a binder resin and an insulating layer, in which the average aspect ratio of the flaky electroconductive particulates in a cut surface of the electrically conductive layer is 7 to 15, an area occupied by components other than the electroconductive particulates is 55 to 80 when the cross-sectional area of the electrically conductive layer before thermocompression bonding is defined as 100, and a difference in area occupied by the components other than the electroconductive particulates before and after the thermocompression bonding under the conditions of 150° C., 2 MPa, and 30 minutes is 5 to 25 when the cross-sectional area of the electrically conductive layer before thermocompression bonding is defined as 100.

CITATION LIST

Patent Literature

Patent Literature 1: JP 2016-115725 A

SUMMARY OF INVENTION

Technical Problem

In the shielded printed wiring board including the electromagnetic wave shielding film described in Patent Literature 1, flaky electroconductive particulates may be located on the interface between the electrically conductive layer and the insulating layer and on the interface between the electrically conductive layer and the printed wiring board. As a result, an area of the bonded surface between the electrically conductive layer and the insulating layer or an area of the contact surface between the electrically conductive layer and the printed wiring board becomes smaller, and the peel strength of the electrically conductive layer may decrease.

Therefore, there has been a problem that the insulating layer of the electromagnetic wave shielding film peeled off, or the electromagnetic wave shielding film itself peeled off the printed wiring board in use.

There has been a problem that the flaky electroconductive particulates were brought out of contact due to the coefficient of thermal expansion or the moisture of the binder resin on exposure to a high temperature and high humidity environment for a long time, and the electrically conductive layer increased in the electrical resistance value. That is, the connection reliability was not sufficient in a high temperature and high humidity environment.

Furthermore, it has also been conceivable to bond the flaky electroconductive particulates with low melting point metal particles for enhancing the connection reliability. In the case where the electrically conductive layer contained a relatively large amount of the low melting point metal particles, exposure to a high temperature and high humidity environment for a long time may however have expanded or shrank the electrically conductive layer to crack the insulating layer layered on the electrically conductive layer. It is conceivable that the reason why the electrically conductive layer expands or shrinks as described above is that heat and moisture in a high temperature and high humidity environment ionize the low melting point metal to diffuse the ionized metal among the flaky electroconductive particulates, and the combination of this and the thermal expansion of the binder resin expands or shrinks the electrically conductive layer locally.

The present invention is an invention that has been made to solve the above-mentioned problem, and an object of the present invention is to provide an electromagnetic wave shielding film including an electroconductive adhesive layer having high peel strength and high connection reliability and enabling suppressing cracks in an insulating layer layered on the electroconductive adhesive layer.

Solution to Problem

An electromagnetic wave shielding film of the present invention is an electromagnetic wave shielding film including: an electroconductive adhesive layer containing electroconductive particles and an adhesive resin composition; and an insulating layer layered on the electroconductive adhesive layer, the electroconductive particles including high melting point electroconductive particles and low melting point electroconductive particles having a lower melting point than the high melting point electroconductive particles, the high melting point electroconductive particles including high melting point flaky particles and high melting point spherical particles, the content of the high melting point flaky particles being 60 to 80% by weight of the total content of the high melting point flaky particles, the high melting point spherical particles, and the low melting point electroconductive particles.

In the electromagnetic wave shielding film of the present invention, the electroconductive particles include high melting point electroconductive particles and low melting point electroconductive particles.

The high melting point electroconductive particles include high melting point flaky particles and high melting point spherical particles.

Since the high melting point flaky particles have sufficient flexibility, in folding the electromagnetic wave shielding film repeatedly, the high melting point flaky particles can also follow the electromagnetic wave shielding film and be bent, and the high melting point flaky particles are hardly displaced. Consequently, the contact between electroconductive particles can be sufficiently maintained, and an increase in the electrical resistance value can be prevented.

When the high melting point spherical particles are contained, high melting point spherical particles are inserted between high melting point flaky particles in the thickness direction of the electroconductive adhesive layer, and a large amount of the adhesive resin composition exists between the high melting point flaky particles. Therefore, the mechanical strength of the electroconductive adhesive layer is improved, and the peel strength increases. The high melting point spherical particles are between the high melting point flaky particles, and the high melting point flaky particles are electrically connected through the high melting point spherical particles. Therefore, the shielding properties of the electroconductive adhesive layer are improved.

The term "high melting point flaky particles" used herein means high melting point electroconductive particles having an aspect ratio of 18 or more in the cut surface of the electroconductive adhesive layer after the electromagnetic wave shielding film is thermocompression bonded under the conditions of 150° C., 2 MPa, and 30 minutes.

The term "high melting point spherical particles" used herein means high melting point electroconductive particles having an aspect ratio of less than 18 in the cut surface of the electroconductive adhesive layer after the electromagnetic wave shielding film is thermocompression bonded under the conditions of 150° C., 2 MPa, and 30 minutes.

The expression "aspect ratio of the high melting point electroconductive particles in the cut surface of the electroconductive adhesive layer" used herein means an average value of the aspect ratios of the high melting point electroconductive particles deduced from an SEM image of the cross section obtained by cutting the electromagnetic wave shielding film after the electromagnetic wave shielding film is thermocompression bonded under the conditions of 150° C., 2 MPa, and 30 minutes. Specifically, the major axes and the minor axes of 100 high melting point electroconductive particles per image are measured in image data photographed at a photographing magnification of 3,000 times using a scanning electron microscope (JSM-6510LA manufactured by JEOL Ltd.) and image processing software (SEM Control User Interface Ver3.10), and the major axes/minor axes of the high melting point electroconductive particles are calculated, and the average value of numerical values except numerical values in the ranges from the upper and lower limits to 15% is defined as the aspect ratio.

When the electromagnetic wave shielding film of the present invention is arranged on a printed wiring board, the electromagnetic wave shielding film is thermocompression bonded.

At this time, the low melting point electroconductive particles are molten to enable the connection between the high melting point flaky particles, between the high melting point spherical particles, and between the high melting point flaky particles and the high melting point spherical particles by metallic bonding.

The contact between the electroconductive particles can therefore be more sufficiently maintained to prevent an increase in the electrical resistance value. Accordingly, the electromagnetic wave shielding film can be improved in connection reliability.

Electronic components are mounted on a printed wiring board on which the electromagnetic wave shielding film of the present invention is disposed, by solder reflow.

When this solder reflow is conducted, it progresses the curing of the electroconductive adhesive layer of the electromagnetic wave shielding film, and remelts the low melting point electroconductive particles to enable stronger connection between the high melting point flaky particles, between the high melting point spherical particles, and between the high melting point flaky particles and the high melting point spherical particles.

As a result, the bulk strength of the electroconductive adhesive layer is improved, and the peel strength is also improved.

In the electromagnetic wave shielding film of the present invention, the content of the high melting point flaky particles is 60 to 80% by weight of the total content of the high melting point flaky particles, the high melting point spherical particles, and the low melting point electroconductive particles.

If the ratio between the electroconductive particles is in such a range, the electromagnetic wave shielding film can suitably exhibit the above-described effect obtained by incorporating the high melting point flaky particles and the high melting point spherical particles and the above-described effect obtained by incorporating the low melting point electroconductive particles.

The content of the low melting point electroconductive particles relatively decreases, and the low melting metal ionized by heat and moisture decreases. The ionized low melting metal is therefore less likely to be dispersed between the high melting point flaky particles, so that the electroconductive adhesive layer hardly expands or shrinks locally, and the insulating layer can be prevented from cracking. It is furthermore conceivable that the high melting point spherical particles enter between the high melting point flaky particles as described above, and even if the low melting metal contained in the low melting point electroconductive particles are ionized, the high melting point spherical particles therefore allows the electroconductive adhesive layer to hardly expand or shrink locally to enable further preventing the insulating layer from cracking.

In the electromagnetic wave shielding film of the present invention, a metal layer may be included between the insulating layer and the electroconductive adhesive layer.

When the electromagnetic wave shielding film includes a metal layer, the electromagnetic wave shielding effect is improved.

In the electromagnetic wave shielding film of the present invention, the weight ratio of the high melting point spherical particles to the low melting point electroconductive particles, [high melting point spherical particles]/[low melting point electroconductive particles], is preferably 0.5 to 29.

If the above-mentioned weight ratio exceeds 29, the ratio means that the weight rate of the low melting point electroconductive particles is relatively low. If the above-mentioned weight ratio is less than 0.5, the ratio means that the weight rate of the low melting point electroconductive particles is relatively high. That is, the adjustment of the above-mentioned weight ratio to 0.5 to 29 regulates the weight rate of the low melting point electroconductive particles to a value that is not too low or too high relatively, and facilitates obtaining the effect of the connection between the high melting point flaky particles, between the high melting point spherical particles, and between the high melting point flaky particles and the high melting point spherical particles by metallic bonding using the low melting point electroconductive particles.

Furthermore, the adjustment hardly reduces the electroconductivity of the electroconductive adhesive layer, and facilitates obtaining sufficient shielding properties.

In the electromagnetic wave shielding film of the present invention, the electroconductive adhesive layer preferably further contains flux, and the content of the flux in the electroconductive adhesive layer is preferably less than 4% by weight.

If the electroconductive adhesive layer contains the flux at the above-mentioned rate, when the low melting point electroconductive particles are molten, it facilitates the connection between the high melting point flaky particles, between the high melting point spherical particles, and between the high melting point flaky particles and the high melting point spherical particles.

In the electromagnetic wave shielding film of the present invention, the melting point of the low melting point electroconductive particles is preferably 120° C. to 190° C.

If the melting point of the low melting point electroconductive particles is in the above-mentioned range, in thermocompression bonding of the electromagnetic wave shielding film to a printed wiring board, the low melting point electroconductive particles are molten suitably to enable further suitable connection between the high melting point flaky particles, between the high melting point spherical particles, and between the high melting point flaky particles and the high melting point spherical particles.

In the electromagnetic wave shielding film of the present invention, the melting point of the high melting point electroconductive particles is preferably 300° C. to 1500° C.

If the melting point of high melting point electroconductive particles is in the above-mentioned range, in thermocompression bonding of the electromagnetic wave shielding film to a printed wiring board, the high melting point electroconductive particles are not molten by heat, and the high melting point electroconductive particles are hardly deformed.

The electromagnetic wave shielding film can therefore suitably exhibit an effect obtained by incorporating the high melting point flaky particles and the high melting point spherical particles.

A shielded printed wiring board of the present invention includes: a printed wiring board including a base film, a printed circuit arranged on the base film, and a coverlay arranged so as to cover the printed circuit; and an electromagnetic wave shielding film including an electroconductive adhesive layer containing electroconductive particles and an adhesive resin composition and an insulating layer layered on the electroconductive adhesive layer, the electromagnetic wave shielding film being arranged on the printed wiring board such that the electroconductive adhesive layer is in contact with the coverlay, the electroconductive particles including high melting point electroconductive particles and low melting point electroconductive particles having a lower melting point than the high melting point electroconductive particles, the high melting point electroconductive particles including high melting point flaky particles and high melting point spherical particles, the content of the high melting point flaky particles being 60 to 80% by weight of the total content of the high melting point flaky particles, the high melting point spherical particles, and the low melting point electroconductive particles.

The shielded wiring board of the present invention may include a metal layer between the insulating layer and the electroconductive adhesive layer.

The shielded printed wiring board of the present invention includes the electromagnetic wave shielding film of the present invention. The shielded printed wiring board of the present invention therefore enables obtaining the above-mentioned effect of the present invention.

In the shielded printed wiring board of the present invention, the printed circuit includes a ground circuit, the coverlay has an opening formed therein for exposing the ground circuit, and the electroconductive adhesive layer preferably fills the opening and is in contact with the ground circuit.

With such a configuration, the electroconductive adhesive layer is electrically connected to the ground circuit. Therefore, a satisfactory grounding effect can be obtained.

Because the electroconductive adhesive layer has the configuration described above, even when there is such an opening, the electroconductive adhesive layer can therefore follow the shape of the opening and fill the opening. Therefore, a gap is hardly formed in the opening.

Advantageous Effects of Invention

According to the present invention, an electromagnetic wave shielding film including an electroconductive adhesive layer having high peel strength and high connection reliability and enabling suppressing cracks in an insulating layer layered on the electroconductive adhesive layer can be provided.

DESCRIPTION OF EMBODIMENTS

Hereinafter, an electromagnetic wave shielding film and a shielded printed wiring board of the present invention will be described specifically. However, the present invention is not limited to the following embodiments, and the present invention can be appropriately modified and applied as long as the gist of the present invention is not changed.

First Embodiment

Figure 1:
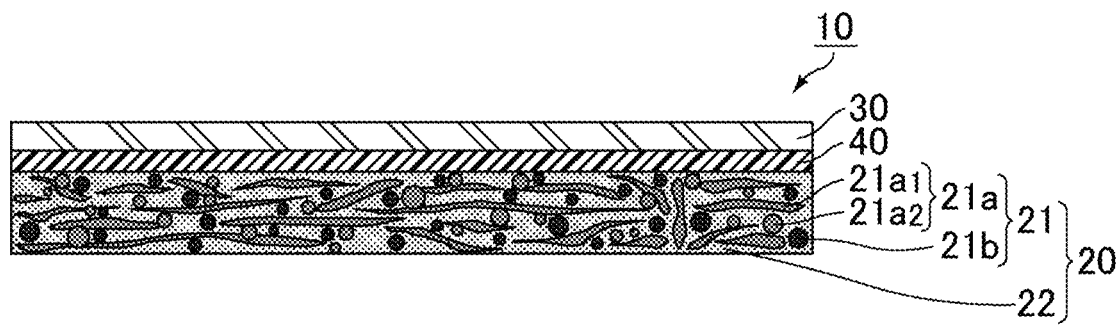
FIG. 1 is a cross-sectional view schematically showing an example of an electromagnetic wave shielding film according to a first embodiment of the present invention.

FIG. 1 is a cross-sectional view schematically showing an example of an electromagnetic wave shielding film according to a first embodiment of the present invention.

As shown in FIG. 1, an electromagnetic wave shielding film 10 includes an electroconductive adhesive layer 20 containing electroconductive particles 21 and an adhesive resin composition 22, an insulating layer 30 layered on the electroconductive adhesive layer 20, and a metal layer 40 arranged between the electroconductive adhesive layer 20 and the insulating layer 30.

The electroconductive particles 21 include high melting point electroconductive particles 21a and low melting point electroconductive particles 21b having a lower melting point than the high melting point electroconductive particles 21a.

The high melting point electroconductive particles 21a includes high melting point flaky particles $21a_1$ and high melting point spherical particles $21a_2$.

The high melting point flaky particles $21a_1$ have sufficient flexibility. In folding the electromagnetic wave shielding film 10 repeatedly, the high melting point flaky particles $21a_1$ can therefore also follow the electromagnetic wave shielding film 10 and be bent, and the high melting point flaky particles $21a_1$ are hardly displaced. Consequently, the contact between the electroconductive particles 21 can be sufficiently maintained, and an increase in the electrical resistance value can be prevented.

If the high melting point spherical particles $21a_2$ are contained, the high melting point spherical particles $21a_2$ are placed between high melting point flaky particles $21a_1$ located in the thickness direction of the electroconductive adhesive layer 20, and a large amount of the adhesive resin composition 22 is present between the high melting point flaky particles $21a_1$. The mechanical strength of the electroconductive adhesive layer 20 is therefore improved, and the peel strength is increased. The high melting point spherical particles $21a_2$ enter between the high melting point flaky particles $21a_1$, and the high melting point flaky particles $21a_1$ are electrically connected by the high melting point spherical particles $21a_2$. The shielding properties of the electroconductive adhesive layer 20 is therefore improved.

In the electromagnetic wave shielding film 10, the high melting point flaky particles $21a_1$ have an average particle size of preferably 0.5 to 30 μm, more preferably 1 to 10 μm.

If the average particle size of high melting point flaky particle $21a_1$ is in this range, the high melting point flaky particles $21a_1$ have moderate sizes and moderate strength.

The electroconductivity and the flex resistance of the electroconductive adhesive layer 20 are therefore improved. Accordingly, the electroconductive adhesive layer 20 can be thinned.

That is, the electroconductive adhesive layer 20 can be thinned while the electroconductivity and the flex resistance of the electroconductive adhesive layer 20 are maintained.

The "particle size of the high melting point flaky particles", the "particle size of the high melting point spherical particles", and the "particle size of the low melting point electroconductive particles" used herein mean values measured by laser diffractive scattering particle size distribution measurement using MT3300EXII, manufactured by MicrotracBEL Corp.

In the electromagnetic wave shielding film 10, the average aspect ratio of the high melting point flaky particles $21a_1$ is preferably 18 to 150, more preferably 20 to 100, further preferably 20 to 50 in the cut surface of the electroconductive adhesive layer 20 after the electromagnetic wave shielding film 10 is heated and pressurized under the conditions of 150° C., 2 MPa, and 30 minutes.

If the average aspect ratio of the high melting point flaky particles $21a_1$ is 18 or more, the high melting point flaky particles $21a_1$ have sufficient flexibility. In folding the electromagnetic wave shielding film 10 repeatedly, the high melting point flaky particles $21a_1$ can therefore also follow the electromagnetic wave shielding film 10 and be bent, and the high melting point flaky particles $21a_1$ are hardly displaced and damaged. Consequently, an increase in the electrical resistance value can be prevented. The adhesion of the electromagnetic wave shielding film is also improved.

If the average aspect ratio of the high melting point flaky particles $21a_1$ is 150 or less, such an average aspect ratio is preferable in that the electrical continuity in the thickness direction easily occurs from the viewpoint of the number of the electroconductive particles. Therefore, the shielding properties are satisfactory.

In the electromagnetic wave shielding film 10, the average particle size of the high melting point spherical particles $21a_2$ is preferably 1 to 10 μm, more preferably 4 to 7 μm.

If the average particle size of the high melting point spherical particles is less than 1 μm, the high melting point spherical particles hardly function as three-dimensional obstacles, and the high melting point flaky particles are easily exposed to the surface of the electroconductive adhesive layer. Consequently, the peel strength of the electroconductive adhesive layer easily decreases.

If the average particle size of the high melting point spherical particles exceeds 10 μm, the electroconductivity of the electroconductive adhesive layer decreases, and shielding properties easily decrease.

In the electromagnetic wave shielding film 10, the melting point of the high melting point electroconductive particles 21a is preferably 300° C. to 1500° C.

If the melting point of the high melting point electroconductive particles 21a is in the above-mentioned range, the high melting point electroconductive particles 21a are not molten and hardly deformed in thermocompression bonding of the electromagnetic wave shielding film 10 to a printed wiring board.

The electromagnetic wave shielding film 10 can therefore suitably exhibit an effect obtained by incorporating the high melting point flaky particles $21a_1$ and the high melting point spherical particles $21a_2$.

The high melting point electroconductive particles $21a$ preferably contain a metal such as silver, copper, nickel, aluminum, or silver-coated copper, which is copper plated with silver.

Since these metals have high electroconductivity, the electroconductive adhesive layer 20 can be improved in electroconductivity.

In the electromagnetic wave shielding film 10, the high melting point flaky particles $21a_1$ and the high melting point spherical particles $21a_2$ may be constituted of the same material, or may be constituted of different materials.

Examples of the method for producing the high melting point spherical particles $21a_2$ include atomization, involving jetting raw material particles from a nozzle and regulating the gas pressure and the like.

The shapes of the high melting point spherical particles $21a_2$ can be controlled by regulating the gas pressure and the like. The high melting point spherical particles $21a_2$ in the form of a perfect sphere or distorted spheres can be produced.

When the high melting point spherical particles $21a_2$ are produced by the atomization, the aspect ratio of the high melting point spherical particles $21a_2$ can be approximated to 1.

When the electromagnetic wave shielding film 10 is arranged on the printed wiring board, the electromagnetic wave shielding film 10 is thermocompression bonded.

At this time, the low melting point electroconductive particles $21b$ is molten to enable the connection between the high melting point flaky particles $21a_1$, between the high melting point spherical particles $21a_2$, and between the high melting point flaky particles $21a_1$ and the high melting point spherical particles $21a_2$ by metallic bonding.

The contact between the electroconductive particles 21 can therefore be more sufficiently maintained, and an increase in the electrical resistance value can be prevented. Accordingly, the electromagnetic wave shielding film 10 can be improved in connection reliability.

Electronic components are mounted on a printed wiring board on which the electromagnetic wave shielding film 10 is arranged, by solder reflow.

When this solder reflow is conducted, it progresses the curing of the electroconductive adhesive layer 20 of the electromagnetic wave shielding film 10, and remelts the low melting point electroconductive particles $21b$ to enable stronger connection between the high melting point flaky particles $21a_1$, between the high melting point spherical particles $21a_2$, and between the high melting point flaky particles $21a_1$ and the high melting point spherical particles $21a_2$.

As a result, the bulk strength of the electroconductive adhesive layer is improved, and the peel strength is also improved.

In the electromagnetic wave shielding film 10, the low melting point electroconductive particles $21b$ are preferably spherical.

In the electromagnetic wave shielding film 10, the average particle size of the low melting point electroconductive particles $21b$ is preferably 1 to 10 μm, more preferably 2 to 6 μm.

If the average particle size of the low melting point electroconductive particles is less than 1 μm, the low melting point electroconductive particles are too small to be easily treated.

If the average particle size of the low melting point electroconductive particles exceeds 10 μm, the specific surface area of the low melting point electroconductive particles is small. In other words, the number of the low melting point electroconductive particles decreases, and is hardly in contact with the high melting point flaky particles and the high melting point spherical particles. In thermocompression bonding of the electromagnetic wave shielding film to a printed wiring board, the connection between the high melting point flaky particles, between the high melting point spherical particles, and between the high melting point flaky particles and the high melting point spherical particles are hardly enabled.

In the electromagnetic wave shielding film 10, the melting point of the low melting point electroconductive particles $21b$ is preferably 120° C. to 190° C., more preferably 130° C. to 150° C.

If the melting point of the low melting point electroconductive particles $21b$ is in the above-mentioned range, the low melting point electroconductive particles $21b$ are suitably molten to enable the suitable connection between the high melting point flaky particles $21a_1$, between the high melting point spherical particles $21a_2$, and between the high melting point flaky particles $21a_1$ and the high melting point spherical particles $21a_2$ in thermocompression bonding of the electromagnetic wave shielding film 10 to a printed wiring board.

The low melting point electroconductive particles $21b$ preferably contains a metal such as tin, bismuth, palladium, or indium; or an alloy of these metals. Among these, the low melting point electroconductive particles $21b$ are preferably an alloy of tin and bismuth.

Since these metals have sufficient electroconductivity, and can form alloy with the high melting point flaky particles $21a_1$ and the high melting point spherical particles $21a_2$, the metals more suitably enable the connection between the high melting point flaky particles $21a_1$, between the high melting point spherical particles $21a_2$, and between the high melting point flaky particles $21a_1$ and the high melting point spherical particles $21a_2$.

In the electromagnetic wave shielding film 10, the content of the high melting point flaky particles $21a_1$ is preferably 60 to 80% by weight, more preferably 65 to 75% by weight, of the total content of the high melting point flaky particles $21a_1$, the high melting point spherical particles $21a_2$, and the low melting point electroconductive particles $21b$.

If the rate of the electroconductive particles 21 is in such a range, the electromagnetic wave shielding film 10 can suitably exhibit an effect obtained by incorporating the high melting point flaky $21a_1$ particles and the high melting point spherical particles $21a_2$ and an effect obtained by incorporating the low melting point electroconductive particles $21b$.

The content of the low melting point electroconductive particles $21b$ decreases relatively, resulting in a decrease in the low melting metal ionized by heat and moisture. Therefore, the ionized low melting metal is hardly dispersed between the high melting point flaky particles $21a_1$, so that the electroconductive adhesive layer 20 hardly expands or shrinks locally to enable preventing the insulating layer 30 from cracking.

It is furthermore conceivable that, as described above, the high melting point spherical particles $21a_2$ enter between the high melting point flaky particles $21a_1$, the high melting point spherical particles $21a_2$ therefore enables the electroconductive adhesive layer 20 to hardly expand or shrink locally to further prevent the insulating layer 30 from cracking even in the case where the low melting metal contained in the low melting point electroconductive particles 21b is ionized.

In the electromagnetic wave shielding film 10, the total content of the high melting point flaky particles $21a_1$, the high melting point spherical particles $21a_2$ and the low melting point electroconductive particles 21b in the electroconductive adhesive layer 20 is preferably 65 to 80% by weight, more preferably 70 to 78% by weight.

If the total content of the high melting point flaky particles, the high melting point spherical particles, and the low melting point electroconductive particles is less than 65% by weight, few electroconductive particles are contained, the electroconductive particles are therefore hardly connected electrically, and the shielding properties of the electromagnetic wave shielding film easily decrease.

If the total content of the high melting point flaky particles, the high melting point spherical particles, and the low melting point electroconductive particles exceeds 80% by weight, the content of the adhesive resin composition decreases relatively. Since the peel strength of the electroconductive adhesive layer depends on the content of the adhesive resin composition, the peel strength of the electroconductive adhesive layer easily decreases.

In electromagnetic wave shielding film 10, the content of the high melting point flaky particles $21a_1$ in the electroconductive adhesive layer 20 is preferably 45 to 60% by weight, more preferably 50 to 55% by weight.

In the electromagnetic wave shielding film 10, the content of the high melting point spherical particles $21a_2$ in the electroconductive adhesive layer 20 is preferably 0.75 to 29.25% by weight, more preferably 7 to 20% by weight.

In electromagnetic wave shielding film 10, the content of the low melting point electroconductive particles 21b in the electroconductive adhesive layer 20 is preferably 0.75 to 29.25% by weight, more preferably 3 to 15% by weight.

In the electromagnetic wave shielding film 10, the weight ratio of the high melting point spherical particles $21a_2$ to the low melting point electroconductive particles 21b, [high melting point spherical particles]/[low melting point electroconductive particles], is preferably 0.5 to 29, more preferably 2 to 5 from the viewpoint of the balance among the peel strength, the connection reliability and the shielding properties of the electroconductive adhesive layer.

If the above-mentioned weight ratio exceeds 29, the ratio means that the weight rate of the low melting point electroconductive particles 21b is relatively low. If the above-mentioned weight ratio is less than 0.5, the ratio means that the weight rate of the low melting point electroconductive particles 21b is relatively high. That is, the adjustment of the above-mentioned weight ratio to 0.5 to 29 regulates the weight rate of the low melting point electroconductive particles 21b to a value that is not too low or too high relatively, and facilitates obtaining the effect of the connection between the high melting point flaky particles $21a_1$, between the high melting point spherical particles $21a_2$, and between the high melting point flaky particles $21a_1$ and the high melting point spherical particles $21a_2$ by metallic bonding using the low melting point electroconductive particles.

Furthermore, the adjustment hardly reduces the electroconductivity of the electroconductive adhesive layer, and facilitates obtaining sufficient shielding properties.

In the electromagnetic wave shielding film 10, the weight ratio of the high melting point flaky particles $21a_1$ to the high melting point spherical particles $21a_2$ to the low melting point electroconductive particles 21b, [high melting point flaky particles]:[high melting point spherical particles]:[low melting point electroconductive particles], is preferably 6 to 8:0.1 to 3.9:0.1 to 3.9.

If the ratio between the electroconductive particles 21 is in such a range, the electromagnetic wave shielding film can suitably exhibit the above-described effect obtained by incorporating the high melting point flaky particles $21a_1$ and the high melting point spherical particles $21a_2$ and the above-described effect obtained by incorporation the low melting point electroconductive particles 21b.

Meanwhile, if the weight rate of the low melting point electroconductive particles 21b is less than the above-mentioned rate, few low melting point electroconductive particles are contained, and the effect of connecting the electroconductive particles is hardly obtained.

The low melting point electroconductive particles are likely to have lower electroconductivity than the high melting point electroconductive particles. If the weight rate of the low melting point electroconductive particles exceeds the above-mentioned rate, the electroconductivity of the electroconductive adhesive layer therefore decreases easily, and the shielding properties decrease.

Although the material of the adhesive resin composition 22 is not limited, in the electromagnetic wave shielding film 10, a thermoplastic resin composition such as a styrene-based resin composition, a vinyl acetate-based resin composition, a polyester-based resin composition, a polyethylene-based resin composition, a polypropylene-based resin composition, an imide-based resin composition, an amide-based resin composition, or an acryl-based resin composition; a thermosetting resin composition such as a phenol-based resin composition, an epoxy-based resin composition, a urethane-based resin composition, a melamine-based resin composition, or an alkyd-based resin composition; or the like can be used as the material.

The material of the adhesive resin composition may be alone or a combination of two or more.

In the electromagnetic wave shielding film 10, the ratio of the area of the adhesive resin composition 22 to the total area of the cut surface is preferably 60 to 95% in the cut surface of the electroconductive adhesive layer 20 after the electromagnetic wave shielding film 10 is heated and pressurized under the conditions of 150° C., 2 MPa, and 30 minutes.

If this area ratio is less than 60%, the rate of electroconductive particles 21 relatively increases, and electroconductive particles 21 are crowded, and the flexibility of the electroconductive adhesive layer 20 decreases. Consequently, the step conformability decreases.

If this area ratio exceeds 95%, the contact points between the electroconductive particles 21 decrease, the electroconductivity decreases. Consequently, the shielding properties decrease.

The expression "ratio of the area of the adhesive resin composition to the total area of the cut surface" used herein means the rate of the area of the adhesive resin composition deduced from an SEM image of a cross section obtained by cutting the electromagnetic wave shielding film.

The specific calculation method is as follows.

The cut surface of the electroconductive adhesive layer is observed using a scanning electron microscope (SEM).

When the cut surface is observed with the SEM from the vertical direction, a contrast difference between the adhesive resin composition and the electroconductive particles is made, and the shapes of the electroconductive particles can be recognized.

In The SEM image of the cross section obtained by cutting the electromagnetic wave shielding film, the portions of the adhesive resin composition and the portions of the electroconductive particles are binarized into black and white using image analysis software "GIMP 2.10.6".

Then, the numbers of black and white pixels are counted to calculate the rate of the area of the adhesive resin composition from the ratio between the numbers of the pixels.

In the electromagnetic wave shielding film 10, the distance between the high melting point flaky particles $21a_1$ is preferably 1.5 μm or more, more preferably 2.0 μm or more, further preferably 4 μm or more in the cut surface of electroconductive adhesive layer 20 after the electromagnetic wave shielding film 10 is heated and pressurized under conditions of 150° C., 2 MPa, and 30 minutes. The distance is preferably 9 μm or less, more preferably 8 μm or less, further preferably 6 μm or less.

If the distance between the high melting point flaky particles $21a_1$ is 1.5 μm or more, the peel strength increases.

If the distance between the high melting point flaky particles $21a_1$ is 9 μm or less, the shielding properties are improved.

The distance between the high melting point flaky particles can be measured by the following method.

The cut surface of the electroconductive adhesive layer is observed using a scanning electron microscope (SEM).

Then, 10 pairs of adjacent high melting point flaky particles per image are selected. Then, the distance between each pair of adjacent high melting point flaky particles in the thickness direction is measured. The values thereof are averaged, and the average value is defined as the distance between the adjacent high melting point flaky particles.

In the electromagnetic wave shielding film 10, the thickness of the electroconductive adhesive layer 20 is preferably 5 to 20 μm, more preferably 8 to 15 μm.

If the thickness of the electroconductive adhesive layer is less than 5 μm, the filling amount of the electroconductive particles increases to secure high shielding performance, and the flexibility and the peel strength cannot be maintained.

If the thickness of the electroconductive adhesive layer exceeds 20 μm, a design for an increase of high shielding performance is facilitated, but the electromagnetic wave shielding film cannot be thinned.

In electromagnetic wave shielding film 10, the electroconductive adhesive layer 20 preferably further contains flux.

The content of the flux in the electroconductive adhesive layer 20 is preferably less than 4% by weight, more preferably less than 2% by weight.

If the electroconductive adhesive layer 20 contains the flux at the above-mentioned rate, the melt of the low melting point electroconductive particles 21b facilitates the connection between the high melting point flaky particles $21a_1$, between the high melting point spherical particles $21a_2$, and between the high melting point flaky particles $21a_1$ and the high melting point spherical particles $21a_2$.

If the content of the flux in the electroconductive adhesive layer is 4% by weight or more, the bulk strength of the conductive adhesive decreases, and the adhesion of the electroconductive adhesive layer easily decreases.

The flux is not limited, and well-known flux such as a polyvalent carboxylic acid, lactic acid, citric acid, oleic acid, stearic acid, glutamic acid, benzoic acid, glycerin, or rosin can be used.

The electroconductive adhesive layer 20 may further contain a flame retardant, an auxiliary flame retardant, a curing accelerator, a tackifier, an antioxidant, a pigment, a dye, a plasticizer, an ultraviolet absorber, an antifoaming agent, a leveling agent, a filler, a viscosity modifier, and the like.

As shown in FIG. 1, the electromagnetic wave shielding film 10 includes the insulating layer 30. Therefore, the handleability is improved. The electroconductive adhesive layer 20 can be insulated from the outside.

The insulating layer 30 is not limited as long as the insulating layer 30 of the electromagnetic wave shielding film 10 has adequate insulating properties, and can protect the electroconductive adhesive layer 20 and the metal layer 40. For example, the insulating layer 30 is preferably constituted of a thermoplastic resin composition, a thermosetting resin composition, an active energy ray curable composition, or the like.

Examples of the above-mentioned thermoplastic resin composition include, but are not limited to, styrene-based resin compositions, vinyl acetate-based resin compositions, polyester-based resin compositions, polyethylene-based resin compositions, polypropylene-based resin compositions, imide-based resin compositions, and acryl-based resin compositions.

Examples of the above-mentioned thermosetting resin compositions include, but are not limited to, phenol-based resin compositions, epoxy-based resin compositions, urethane-based resin compositions, melamine-based resin compositions, and alkyd-based resin compositions.

Examples of the above-mentioned active energy ray curable composition include, but are not limited to, polymerizable compounds having at least two (meth)acryloyloxy groups in a molecule.

The insulating layer 30 may be constituted of only one material and may be constituted of two or more materials.

The insulating layer 30 may contain a curing accelerator, a tackifier, an antioxidant, a pigment, a dye, a plasticizer, an ultraviolet absorber, an antifoaming agent, a leveling agent, a filler, a flame retardant, a viscosity modifier, an antiblocking agent, and the like as needed.

The thickness of the insulating layer 30 is not limited, and can be appropriately set as needed, but the thickness is preferably 1 to 15 μm, more preferably 3 to 10 μm.

As shown in FIG. 1, the electromagnetic wave shielding film 10 includes the metal layer 40. Therefore, the electromagnetic wave shielding effect is improved.

The metal layer 40 may include a layer containing a material such as gold, silver, copper, aluminum, nickel, tin, palladium, chromium, titanium, or zinc, and preferably includes a copper layer.

Copper is a material suitable for the metal layer 40 from the viewpoint of electroconductivity and economical efficiency.

The metal layer 40 may include a layer containing an alloy of the above-mentioned metals.

The thickness of the metal layer 40 is preferably 0.01 to 10 μm.

If the thickness of the metal layer is less than 0.01 μm, a sufficient shielding effect is hardly obtained.

If the thickness of the metal layer exceeds 10 μm, the electromagnetic wave shielding film is hardly flexed.

In electromagnetic wave shielding film 10, an anchor coat layer may be formed between the insulating layer 30 and the metal layer 40.

Examples of the material of the anchor coat layer include a urethane resin, an acryl resin, a core-shell type composite resin having a urethane resin as shells and having an acryl resin as cores, an epoxy resin, an imide resin, an amide resin, a melamine resin, a phenol resin, a urea-formaldehyde resin, a blocked isocyanate obtained by reacting a blocking agent such as phenol with a polyisocyanate, polyvinyl alcohol, and polyvinylpyrrolidone.

Next, the method for manufacturing a shielded printed wiring board using the electromagnetic wave shielding film according to the first embodiment of the present invention will be described.

Figure 2:
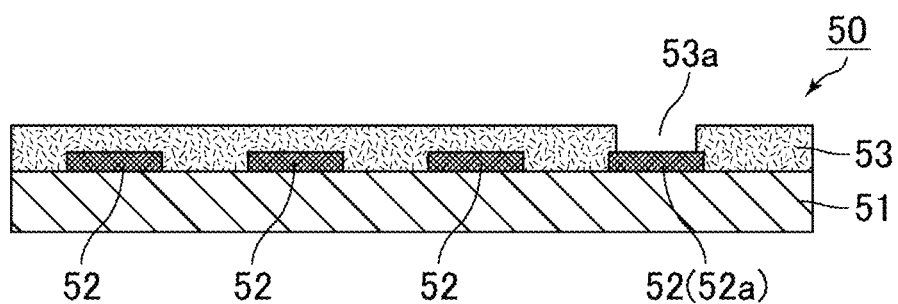
FIG. 2 is a cross-sectional view schematically showing a printed wiring board provision step in a method for manufacturing a shielded printed wiring board using the electromagnetic wave shielding film according to the first embodiment of the present invention.

FIG. 2 is a cross-sectional view schematically showing a printed wiring board provision step in the method for manufacturing the shielded printed wiring board using the electromagnetic wave shielding film according to the first embodiment of the present invention.

Figure 3:
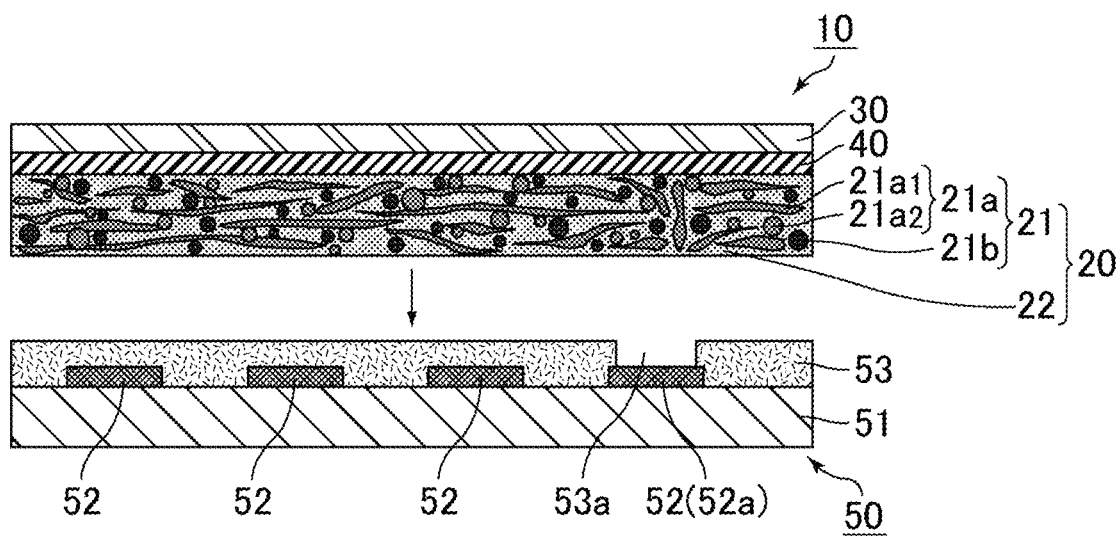
FIG. 3 is a cross-sectional view schematically showing an electromagnetic wave shielding film pasting step in the method for manufacturing a shielded printed wiring board using the electromagnetic wave shielding film according to the first embodiment of the present invention.

FIG. 3 is a cross-sectional view schematically showing an electromagnetic wave shielding film pasting step in the method for manufacturing the shielded printed wiring board using the electromagnetic wave shielding film according to the first embodiment of the present invention.

Figure 4:
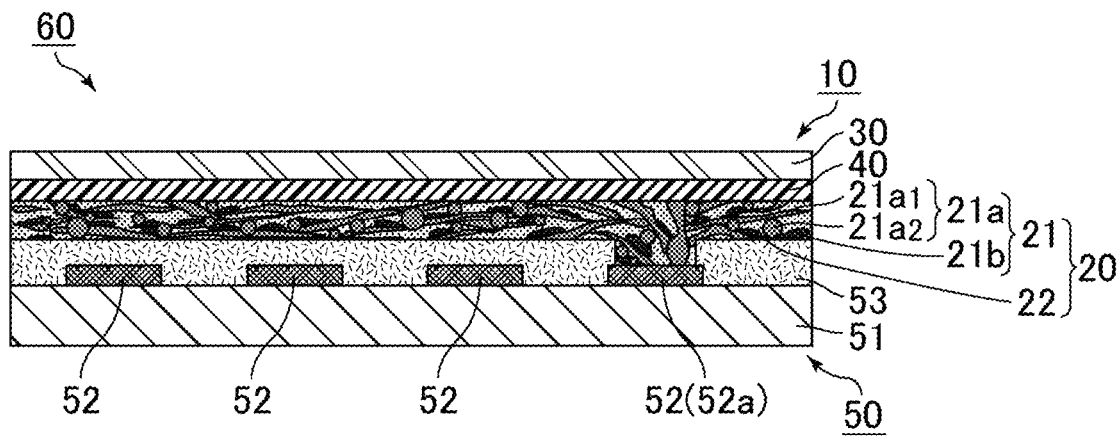
FIG. 4 is a cross-sectional view schematically showing a heating and pressurization step in a method for manufacturing a shielded printed wiring board using the electromagnetic wave shielding film according to the first embodiment of the present invention.

FIG. 4 is a cross-sectional view schematically showing a heating and pressurization step in the method for manufacturing the shielded printed wiring board using the electromagnetic wave shielding film according to the first embodiment of the present invention.

(1) Printed Wiring Board Provision Step

As shown in FIG. 2, a printed wiring board 50 including a base film 51, a printed circuit 52 arranged on the base film 51, and a coverlay 53 arranged so as to cover the printed circuit 52 is first provided.

In the printed wiring board 50, the printed circuit 52 includes a ground circuit 52a, and an opening 53a for exposing the ground circuit 52a is formed in the coverlay 53.

The materials of the base film 51 and the coverlay 53 are not limited, but preferably contain an engineering plastic. Examples of such an engineering plastic include resins such as polyethylene terephthalate, polypropylene, crosslinked polyethylene, polyesters, polybenzimidazole, polyimides, polyimide amides, polyetherimides, and polyphenylene sulfide.

When flame retardance is required, among these engineering plastics, a polyphenylene sulfide film is preferable. When heat resistance is required, a polyimide film is preferable. The thickness of the base film 51 is preferably 10 to 40 μm. The thickness of the coverlay 53 is preferably 10 to 30 μm.

The printed circuit 52 is not limited, but can be formed by subjecting an electroconductive material to etching treatment.

Examples of the electroconductive material include copper, nickel, silver, and gold.

(2) Electromagnetic Wave Shielding Film Pasting Step

As shown in FIG. 3, an electromagnetic wave shielding film 10 is then provided, and the electromagnetic wave shielding film 10 is arranged on the printed wiring board 50 such that the electroconductive adhesive layer 20 is in contact with the coverlay 53.

(3) Heating and Pressurization Step

As shown in FIG. 4, the electromagnetic wave shielding film 10 is then heated and pressurized, and is pasted on the printed wiring board 50.

As long as the heating and pressurization conditions are conditions under which the low melting point electroconductive particles are molten, the conditions are not limited. For example, the conditions are preferably 150° C. to 200° C., 2 to 5 MPa, and 1 to 10 minutes.

The electroconductive adhesive layer 20 fills the opening 53a by the heating and pressurization step.

The heating and pressurization step melts the low melting point electroconductive particles 21b, resulting in the connection between the high melting point flaky particles $21a_1$, between the high melting point spherical particle $21a_2$, and between the high melting point flaky particles $21a_1$ and the high melting point spherical particles $21a_2$.

A shielded printed wiring board 60 can be manufactured through the above-mentioned steps.

The shielded printed wiring board 60 is also an aspect of the shielded printed wiring board of the present invention.

As shown in FIG. 4, the shielded printed wiring board 60 includes the printed wiring board 50 including the base film 51, the printed circuit 52 arranged on the base film 51, and the coverlay 53 arranged so as to cover the printed circuit 52 and the electromagnetic wave shielding film 10 including the electroconductive adhesive layer 20 containing the electroconductive particles 21 and the adhesive resin composition 22.

In the shielded printed wiring board 60, the electromagnetic wave shielding film 10 is arranged on the printed wiring board 50 so that electroconductive adhesive layer 20 is in contact with the coverlay 53.

The electroconductive particles 21 include the high melting point electroconductive particles 21a and the low melting point electroconductive particles 21b having a lower melting point than the high melting point electroconductive particles 21a. The high melting point electroconductive particles 21a include the high melting point flaky particles $21a_1$ and the high melting point spherical particles $21a_2$, and the low melting point electroconductive particles 21b includes the low melting point electroconductive particles 21b.

In the shielded printed wiring board 60, the content of the high melting point flaky particles $21a_1$ is preferably 60 to 80% by weight, more preferably 65 to 75% by weight, of the total content of the high melting point flaky particles $21a_1$, the high melting point spherical particles $21a_2$, and the low melting point electroconductive particles 21b.

In the shielded printed wiring board 60, the printed circuit 52 includes a ground circuit 52a, and an opening 53a for exposing the ground circuit 52a is formed in the coverlay 53, and the electroconductive adhesive layer 20 fills the opening 53a and is in contact with the ground circuit 52a.

With such a configuration, the electroconductive adhesive layer 20 is electrically connected to the ground circuit 52a. Therefore, a satisfactory grounding effect can be obtained.

Because the electroconductive adhesive layer 20 has the configuration described above, even when there is such an opening 53a, the electroconductive adhesive layer 20 can therefore follow the shape of the opening 53a and fill the opening 53a. Therefore, a gap is hardly formed in the opening 53a.

The shielded printed wiring board 60 includes the electromagnetic wave shielding film 10. The shielded printed wiring board 60 therefore enables obtaining the effect of the electromagnetic wave shielding film 10.

Although, in the shielded printed wiring board 60, the opening 53a for exposing the ground circuit 52a is formed in the coverlay 53 of the printed wiring board 50, the opening may not be formed in the coverlay of the printed wiring board in the shielded printed wiring board of the present invention.

Second Embodiment

Next, an electromagnetic wave shielding film according to a second embodiment of the present invention will be described.

Figure 5:
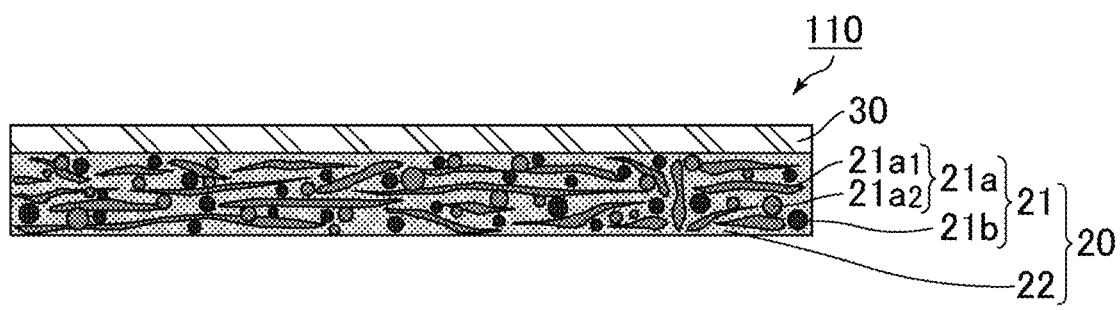
FIG. 5 is a cross-sectional view schematically showing an example of an electromagnetic wave shielding film according to a second embodiment of the present invention.

FIG. 5 is a cross-sectional view schematically showing an example of an electromagnetic wave shielding film according to a second embodiment of the present invention.

An electromagnetic wave shielding film 110 shown in FIG. 5 has the same configuration as the above-mentioned electromagnetic wave shielding film 10 according to the first embodiment of the present invention except that the metal layer 40 is not arranged. In the configuration of the electromagnetic wave shielding film of the second embodiment, the electroconductive adhesive layer 20 has a role in shielding electromagnetic waves.

That is, the electromagnetic wave shielding film 110 includes the electroconductive adhesive layer 20 containing the electroconductive particles 21 and the adhesive resin composition 22 and the insulating layer 30 layered on the electroconductive adhesive layer 20.

The electroconductive particles 21 includes the high melting point electroconductive particles 21a and the low melting point electroconductive particles 21b having a lower melting point than the high melting point electroconductive particles 21a.

The high melting point electroconductive particles 21a includes the high melting point flaky particles $21a_1$ and the high melting point spherical particles $21a_2$.

A preferable feature of the electroconductive adhesive layer 20, the high melting point flaky particles $21a_1$, the high melting point spherical particles $21a_2$, the low melting point electroconductive particles 21b, the adhesive resin composition 22, and the insulating layer 30 in the electromagnetic wave shielding film 110 is the same as the preferable feature of the electroconductive adhesive layer 20, the high melting point flaky particles $21a_1$, the high melting point spherical particles $21a_2$, the low melting point electroconductive particles 21b, the adhesive resin composition 22, and the insulating layer 30 in electromagnetic wave shielding film 10.

Even if the electromagnetic wave shielding film 110 has such a configuration, the electromagnetic wave shielding film 110 has the electroconductive adhesive layer 20 with high peel strength and high connection reliability, and enables suppressing cracks in the insulating layer 30 in the same way as the electromagnetic wave shielding film 10 according to the above-described first embodiment.

EXAMPLES

Hereinafter, the Examples for describing the present invention more specifically will be shown, but the present invention is not limited to these Examples.

Example 1

An epoxy resin was applied to a transfer film and heated at 100° C. for 2 minutes using an electric oven, and an insulating layer having a thickness of 5 μm was produced.

High melting point flaky particles (silver-coated copper powder), high melting point spherical particles (copper powder), low melting point electroconductive particles (tin-bismuth powder (tin: 72% by weight, bismuth: 28% by weight)), flux (rosin), and an adhesive resin composition (epoxy-cresol novolac resin: produced by DIC Corporation "EPICLON N-655-EXP") described in Table 1 were then provided. These were mixed so that the blended amounts thereof were blended amounts described in Table 1. An electroconductive resin composition was produced. The average particle sizes of the high melting point flaky particles, the high melting point spherical particles, and the low melting point electroconductive particles were measured by laser diffractive scattering particle size distribution measurement using an MT3300EXII, manufactured by Microtrac-BEL Corp.

Then, the electroconductive resin composition was applied onto the insulating layer to form an electroconductive adhesive layer having a thickness of 15 μm, and an electromagnetic wave shielding film according to Example 1 was produced.

Examples 2 to 10 and Comparative Examples 1 to 8

Electromagnetic wave shielding films according to Examples 2 to 10 and Comparative Examples 1 to 8 were manufactured in the same way as in Example 1 except that the types of the high melting point flaky particles, the high melting point spherical particles, and the low melting point electroconductive particles, the blended ratio therebetween, and the contents thereof were as shown in Table 1 and Table 2.

TABLE 1

| | | Example 1 | Example 2 | Example 3 | Example 4 | Example 5 |
|---|---|---|---|---|---|---|
| High melting point flaky particles | Material | Silver-coated copper powder | Silver-coated copper powder | Silver-coated copper powder | Sliver-coated copper powder | Saver-coated copper powder |
| | Average particle size (μm) | 6 | 6 | 6 | 6 | 6 |
| | Aspect ratio | 26.5 | 26.5 | 26.5 | 26.5 | 26.5 |
| | Content (wt %) | 52.50 | 52.50 | 52.50 | 52.50 | 45.00 |
| High melting point spherical particles | Material | Copper powder | Copper powder | Copper powder | Copper powder | Copper powder |
| | Average particle size (μm) | 5 | 5 | 5 | 5 | 5 |
| | Aspect ratio | 1.2 | 1.2 | 1.2 | 1.2 | 1.2 |
| | Content (wt %) | 21.75 | 18.75 | 15.00 | 7.50 | 29.25 |
| Low melting point electroconductive particles | Material | Tin-bismuth powder | Tin-bismuth powder | Tin-bismuth powder | Tin-bismuth powder | Tin-bismuth powder |
| | Average particle size (μm) | 5 | 5 | 5 | 5 | 5 |
| | Melting point (° C.) | 139 | 139 | 139 | 139 | 139 |
| | Content (wt %) | 0.75 | 3.75 | 7.50 | 15.00 | 0.75 |
| Total content of electroconductive particles (wt %) | | 75 | 75 | 75 | 75 | 75 |
| Content of adhesive resin composition (wt %) | | 23 | 23 | 23 | 23 | 23 |
| Content of flux (rosin) (wt %) | | 2 | 2 | 2 | 2 | 2 |

TABLE 1-continued

|  |  |  |  |  |  |  |
|---|---|---|---|---|---|---|
| Weight ratio of electroconductive particles (high melt point flaky:high melt point spherical:low melt point electroconductive) | | 7:2.9:0.1 | 7:2.5:0,5 | 7:2:1 | 7:1:2 | 6:3.9:0.1 |
| Thickness of electroconductive adhesive layer (μm) | | 15 | 15 | 15 | 15 | 15 |
| Evaluation results | Peel strength before reflow (N/cm) | 3.5 | 3.6 | 3.4 | 3.0 | 4.5 |
|  | Peel strength after two times of reflow (N/cm) | 4.3 | 4.7 | 4.3 | 4.1 | 5.6 |
|  | Resistance before high temp/humidity load (mΩ) | 16 | 19 | 23 | 29 | 18 |
|  | Resistance after high temp/humidity load (mΩ) | 225 | 129 | 104 | 77 | 298 |
|  | Appearance after high temp/humidity load (mΩ) | Good | Good | Good | Good | Good |
|  | Shielding properties (dB) | 76 | 73 | 72 | 71 | 74 |

|  |  | Example 6 | Example 7 | Example 8 | Example 9 | Example 10 |
|---|---|---|---|---|---|---|
| High melting point flaky particles | Material | Silver-coated copper powder | Silver-coated copper powder | Silver-coated copper powder | Silver-coated copper powder | Silver-coated copper powder |
|  | Average particle size (μm) | 6 | 6 | 6 | 6 | 6 |
|  | Aspect ratio | 26.5 | 26.5 | 26.5 | 26.5 | 26.5 |
|  | Content (wt %) | 45.00 | 45.00 | 60.00 | 60.00 | 60.00 |
| High melting point spherical particles | Material | Copper powder | Copper powder | Copper powder | Copper powder | Copper powder |
|  | Average particle size (μm) | 5 | 5 | 5 | 5 | 5 |
|  | Aspect ratio | 1.2 | 1.2 | 1.2 | 1.2 | 1.2 |
|  | Content (wt %) | 15.00 | 0.75 | 14.25 | 7.50 | 0.75 |
| Low melting point electroconductive particles | Material | Tin-bismuth powder | Tin-bismuth powder | Tin-bismuth powder | Tin-bismuth powder | Tin-bismuth powder |
|  | Average particle size (μm) | 5 | 5 | 5 | 5 | 5 |
|  | Melting point (° C.) | 139 | 139 | 139 | 139 | 139 |
|  | Content (wt %) | 15.00 | 29.25 | 0.75 | 7.50 | 14.25 |
| Total content of electroconductive particles (wt %) | | 75 | 75 | 75 | 75 | 75 |
| Content of adhesive resin composition (wt %) | | 23 | 23 | 23 | 23 | 23 |
| Content of flux (rosin) (wt %) | | 2 | 2 | 2 | 2 | 2 |
| Weight ratio of electroconductive particles (high melt point flaky:high melt point spherical:low melt point electroconductive) | | 6:2:2 | 6:0.1:3.9 | 8:1.9:0.1 | 8:1:1 | 8:0.1:1.9 |
| Thickness of electroconductive adhesive layer (μm) | | 15 | 15 | 15 | 15 | 15 |
| Evaluation results | Peel strength before reflow (N/cm) | 4.3 | 4.1 | 2.4 | 2.3 | 2.1 |
|  | Peel strength after two times of reflow (N/cm) | 5.4 | 5.3 | 3.6 | 3.5 | 3.4 |
|  | Resistance before high temp/humidity load (mΩ) | 21 | 31 | 14 | 22 | 30 |
|  | Resistance after high temp/humidity load (mΩ) | 80 | 69 | 183 | 110 | 82 |
|  | Appearance after high temp/humidity load (mΩ) | Good | Good | Good | Good | Good |
|  | Shielding properties (dB) | 70 | 68 | 77 | 73 | 71 |

TABLE 2

|  |  | Comp. Ex. 1 | Comp. Ex. 2 | Comp. Ex. 3 | Comp. Ex. 4 | Comp. Ex. 5 |
|---|---|---|---|---|---|---|
| High melting point flaky particles | Material | Saver-coated copper powder | Silver-coated copper powder | Silver-coated copper powder | Silver-coated copper powder | Silver-coated copper powder |
|  | Average particle size (μm) | 6 | 6 | 6 | 6 | 6 |
|  | Aspect ratio | 26.5 | 26.5 | 26.5 | 26.5 | 26.5 |
|  | Content (wt %) | 52.50 | 52.50 | 52.50 | 52.50 | 37.50 |
| High melting point spherical particles | Material | — | — | — | Copper powder | Copper powder |
|  | Average particle size (μm) | — | — | — | 5 | 5 |
|  | Aspect ratio | — | — | — | 1.2 | 1.2 |
|  | Content (wt %) | 0.00 | 0.00 | 0.00 | 22.50 | 36.75 |
| Low melting point electroconductive particles | Material | Tin-bismuth powder | Tin-bismuth powder | Tin-bismuth powder | Tin-bismuth powder | Tin-bismuth powder |
|  | Average particle size (μm) | 5 | 5 | 5 | 5 | 5 |
|  | Melting point (° C.) | 139 | 139 | 139 | 139 | 139 |
|  | Content (wt %) | 22.50 | 22.50 | 22.50 | 0.00 | 0.75 |
| Total content of electroconductive particles (wt %) | | 75 | 75 | 75 | 75 | 75 |
| Content of adhesive resin composition (wt %) | | 23 | 21 | 19 | 23 | 23 |
| Content of flux (rosin) (wt %) | | 2 | 4 | 6 | 2 | 2 |
| Weight ratio of electroconductive particles (high melt point:flaky high melt point spherical:low melt point electroconductive) | | 7:0:3 | 7:0:3 | 7:0:3 | 7:3:0 | 5:4.9:0.1 |
| Thickness of electroconductive adhesive layer (μm) | | 15 | 15 | 15 | 15 | 15 |
| Evaluation results | Peel strength before reflow (N/cm) | 3.2 | 2.7 | 1.8 | 3.0 | 6.0 |
|  | Peel strength after two times of reflow (N/cm) | 4.4 | 2.9 | 2.0 | 3.1 | 7.1 |

TABLE 2-continued

|  |  |  |  |  |  |  |
|---|---|---|---|---|---|---|
|  | Resistance before high temp/humidity load (mΩ) | 32 | 34 | 37 | 16 | 50 |
|  | Resistance after high temp/humidity load (mΩ) | 76 | 69 | 65 | 532 | 743 |
|  | Appearance after high temp/humidity load (mΩ) | Poor | Poor | Poor | Good | Good |
|  | Shielding properties (dB) | 69 | 68 | 68 | 80 | 63 |

|  |  | Comp. Ex. 6 | Comp. Ex. 6 | Comp. Ex. 6 | Comp. Ex. 7 | Comp. Ex. 8 |
|---|---|---|---|---|---|---|
| High melting point flaky particles | Material | Silver-coated copper powder | Silver-coated copper powder | Silver-coated copper powder | Silver-coated copper powder | Silver-coated copper powder |
|  | Average particle size (μm) | 6 | 6 | 6 | 6 | 6 |
|  | Aspect ratio | 26.5 | 26.5 | 26.5 | 26.5 | 26.5 |
|  | Content (wt %) | 37.50 | 37.50 | 67.50 | 67.50 | 67.50 |
| High melting point spherical particles | Material | Copper powder | Copper powder | Copper powder | Copper powder | Copper powder |
|  | Average particle size (μm) | 5 | 5 | 5 | 5 | 5 |
|  | Aspect ratio | 1.2 | 1.2 | 1.2 | 1.2 | 1.2 |
|  | Content (wt %) | 18.75 | 0.75 | 6.75 | 3.75 | 0.75 |
| Low melting point electroconductive particles | Material | Tin-bismuth powder | Tin-bismuth powder | Tin-bismuth powder | Tin-bismuth powder | Tin-bismuth powder |
|  | Average particle size (μm) | 5 | 5 | 5 | 5 | 5 |
|  | Melting point (° C.) | 139 | 139 | 139 | 139 | 139 |
|  | Content (wt %) | 18.75 | 36.75 | 0.75 | 3.75 | 6.75 |
| Total content of electroconductive particles (wt %) |  | 75 | 75 | 75 | 75 | 75 |
| Content of adhesive resin composition (wt %) |  | 23 | 23 | 23 | 23 | 23 |
| Content of flux (rosin) (wt %) |  | 2 | 2 | 2 | 2 | 2 |
| Weight ratio of electroconductive particles (high melt point:flaky high melt point spherical:low melt point electroconductive) |  | 5:2.5:2.5 | 5:0.1:4.9 | 9:0.9:0.1 | 9:0.5:0.5 | 9:0.1:0.9 |
| Thickness of electroconductive adhesive layer (μm) |  | 15 | 15 | 15 | 15 | 15 |
| Evaluation results | Peel strength before reflow (N/cm) | 5.5 | 5.4 | 1.2 | 1.0 | 0.9 |
|  | Peel strength after two times of reflow (N/cm) | 6.5 | 5.5 | 2.3 | 2.0 | 1.9 |
|  | Resistance before high temp/humidity load (mΩ) | 83 | 102 | 12 | 15 | 16 |
|  | Resistance after high temp/humidity load (mΩ) | 622 | 548 | 175 | 120 | 96 |
|  | Appearance after high temp/humidity load (mΩ) | Good | Good | Good | Good | Good |
|  | Shielding properties (dB) | 59 | 58 | 80 | 79 | 78 |

(Heating and Pressurization Test)

A polyimide resin plate having a thickness of 25 μm was provided. The electromagnetic wave shielding film according to each of Examples or each of Comparative Examples was arranged such that the electroconductive adhesive layer is contact with the polyimide resin plate.

Then, the electromagnetic wave shielding film according to each of Examples or each of Comparative Examples was heated and pressurized under the conditions of 150° C., 2 MPa, 30 minutes, and pasted on the polyimide resin plate.

The electromagnetic wave shielding film after the heating and pressurization test was cut, and an SEM image was photographed. The aspect ratios of the electroconductive particles were measured using image processing software (SEM Control User Interface Ver3.10). Table 1 and Table 2 show the results.

An SEM image of a cross section of the electromagnetic wave shielding film according to Example 1 is shown as a representative example.

Figure 6:
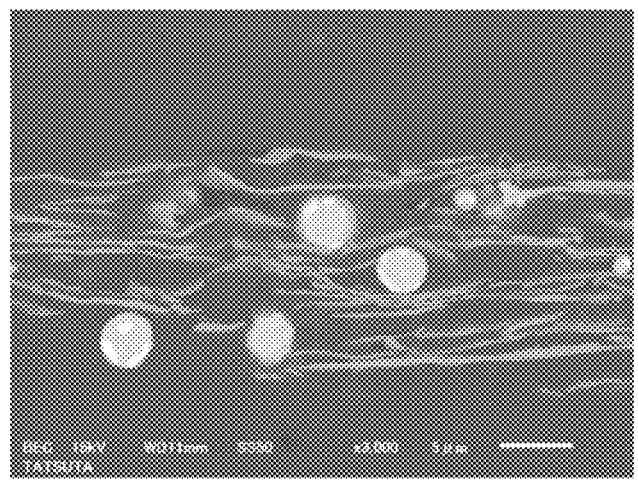
FIG. 6 is an SEM image of a cross section of an electromagnetic wave shielding film according to Example 1.

FIG. 6 is the SEM image of the cross section of the electromagnetic wave shielding film according to Example 1.

(Peel Strength Test)

Each of the electromagnetic wave shielding films according to Examples and Comparative Examples was separately pasted on the polyimide resin plate under the same condition as the above-mentioned heating and pressurization conditions, and the peel strength when the electromagnetic wave shielding film was exfoliated from the polyimide resin plate was then measured.

Each of the electromagnetic wave shielding films according to Examples and Comparative Examples was separately pasted on the polyimide resin plate under the same conditions as the above-mentioned heating and pressurization conditions, and the plate was passed through a reflow furnace under the conditions of a TOP temperature of 260° C. twice and then measured for the peel strength when the electromagnetic wave shielding film was exfoliated from the polyimide resin plate.

Table 1 and Table 2 shows the results of the peel strength test.

It is determined based on the peel strength (340 N/m or more) of the coverlay in the integral standard for products, materials, and a testing method of flexible printed wiring boards (JPCA-DG04) that if the peel strength is 0.34 N/cm or more, the peel strength is sufficient.

(Connection Resistance Value Measurement Test)

The electrical resistance value of the electromagnetic wave shielding film according to each Examples or each Comparative Examples was measured by the following method using the electromagnetic wave shielding film according to each of Examples or each of Comparative Examples. Table 1 and Table 2 show the measurement results.

Figure 7A:
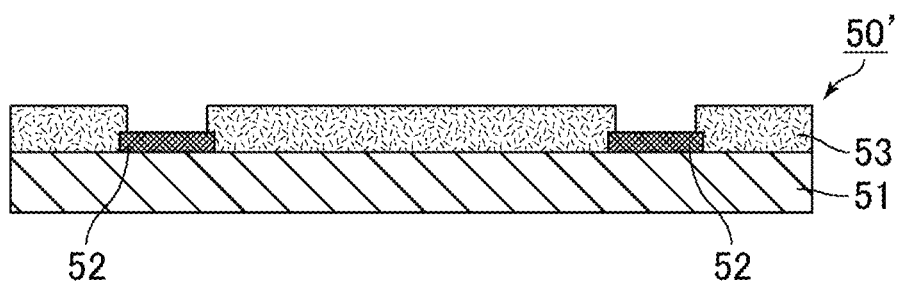
FIG. 7A is a side sectional view schematically showing a method for a connection resistance value measurement test.
Figure 7B:
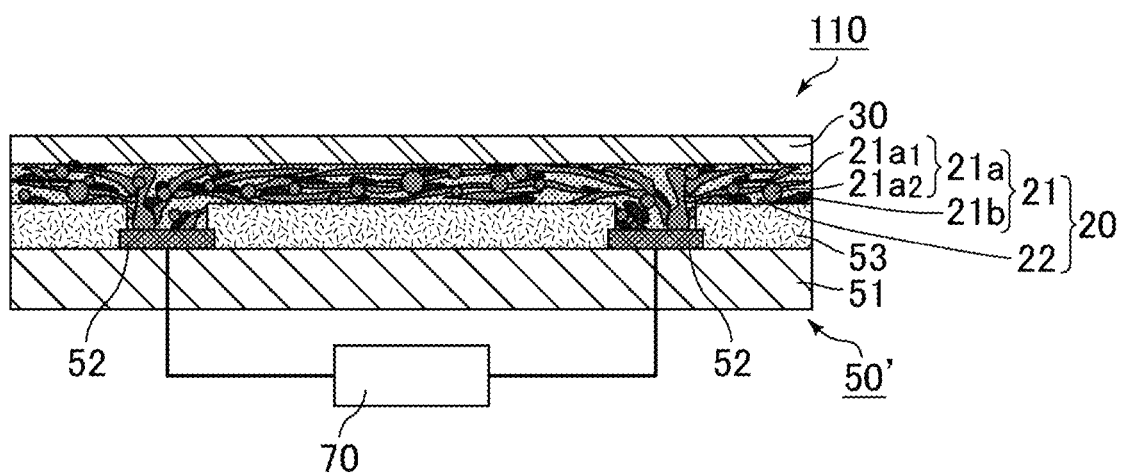
FIG. 7B is a side sectional view schematically showing the method for the connection resistance value measurement test.

FIG. 7A and FIG. 7B are side sectional views schematically showing a method for the connection resistance value measurement test.

As shown in FIG. 7A, a printed wiring board 50' for measuring the connection resistance value in which two printed circuits 52 not connected to each other were formed on a base film 51, and a coverlay 53 covering the base film 51 and the printed circuits 52 was formed was provided. Openings 53a having a diameter of 0.5 mm for exposing parts of the printed circuits 52 were formed in the coverlay 53.

As shown in FIG. 7B, the electromagnetic wave shielding film 110 is then pasted on the printed wiring board 50' for measuring the connection resistance value such that the electroconductive adhesive layer 20 of the electromagnetic wave shielding film 110 according to each of Examples or each of Comparative Examples was in contact with the coverlay 53. The printed wiring board on which the electromagnetic wave shielding film was pasted was compression bonded with a press under the conditions of temperature: 170° C., time: 240 seconds, and pressure: 3 MPa. The electroconductive adhesive layer 20 enters the openings 53a thereby, the electroconductive adhesive layer 20 and the printed circuits 52 are in contact, and the printed circuits 52 can be electrically connected through the electroconductive adhesive layer 20.

The electrical resistance value between the printed circuits 52 was then measured with a resistor 70 (resistance value before a high temperature and high humidity load).

The printed wiring board 50' for measuring the connection resistance value on which the electromagnetic wave shielding film 110 was pasted was then left to stand in an environment of temperature: 85° C., humidity: 85%, and time: 1000 hours. The electrical resistance value between the printed circuits 52 was measured with the resistor 70 by the same method (resistance value after the high temperature and high humidity load).

Table 1 and Table 2 show the results.
(Appearance Observation After High Temperature and High Humidity Load)

The resistance value was measured after the high temperature and high humidity load, it was then visually confirmed whether the insulating layer of each electromagnetic wave shielding film cracked or not.

The evaluation criteria are as follows. Table 1 and Table 2 show the results.

Good: The insulating layer does not crack.
Poor: The insulating layer cracks.
(Evaluation of Shielding Properties)

The shielding properties of the electromagnetic wave shielding film according to each of Examples or each of Comparative Examples was evaluated by the KEC method using an electromagnetic wave shielding effect measuring apparatus developed by KEC Electronic Industry Development Center.

Figure 8:
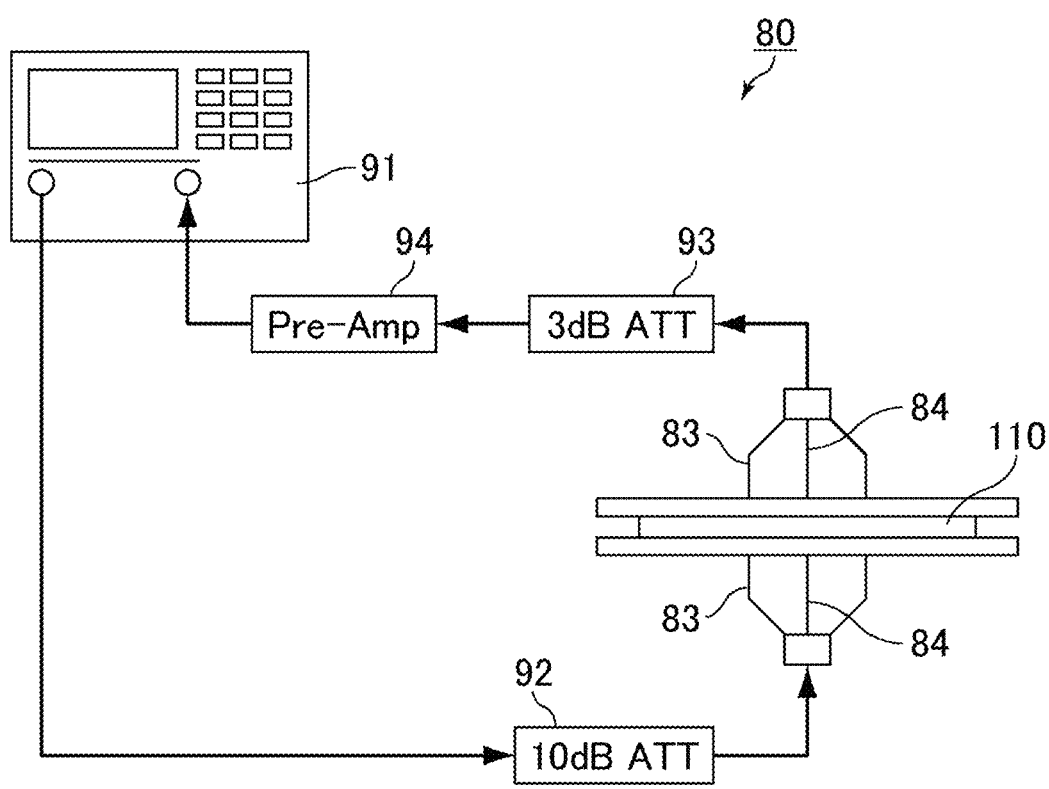
FIG. 8 is a schematic view schematically showing a system configuration used in the KEC method.

FIG. 8 is a schematic view schematically showing a system configuration used in the KEC method.

The system to be used in the KEC method is constituted of an electromagnetic wave shielding effect measuring apparatus 80, a spectrum analyzer 91, an attenuator 92 for damping 10 dB, an attenuator 93 for damping 3 dB, and a preamplifier 94.

As shown in FIG. 8, the electromagnetic wave shielding effect measuring apparatus 80 is provided with two opposed measurement jigs 83. The electromagnetic wave shielding film (indicated with the reference numeral 110 in FIG. 8) according to each of Examples or each of Comparative Examples is installed so that the electromagnetic wave shielding film is clamped between these measurement jigs 83. The dimensional distribution of a TEM cell (Transverse Electro Magnetic Cell) is introduced into the measurement jigs 83, which have a structure symmetrically divided in the plane perpendicular to the transmission axis thereof. However, flat central conductors 84 and the respective measurement jigs 83 are spaced and arranged to prevent the formation of a short circuit by the insertion of the electromagnetic wave shielding film 110.

In the KEC method, a signal output from the spectrum analyzer 91 is first input into the measurement jig 83 on the transmitting side through the attenuator 92. The signal received at the measurement jig 83 on the receiving side and passed through the attenuator 93 is then amplified at the preamplifier 94, and the signal level is measured with the spectrum analyzer 91. The spectrum analyzer 91 outputs attenuation when the electromagnetic wave shielding film 110 is installed in the electromagnetic wave shielding effect measuring apparatus 80 based on a state in which the electromagnetic wave shielding film 110 is not installed in the electromagnetic wave shielding effect measuring apparatus 80.

The electromagnetic wave shielding film according to each of Examples or each of Comparative Examples was cut to a 15-cm square, and the shielding properties at 200 MHz were measured under the conditions of a temperature of 25° C., a relative humidity of 30 to 50% using such an apparatus. Table 1 and Table 2 shows the measurement results.

As shown in Tables 1 and 2, the electromagnetic wave shielding films according to the Examples of the present invention were proved to be excellent in peel strength, connection reliability, and shielding properties and further enable suppressing cracks in the insulating layer.

REFERENCE SIGNS LIST

10, 110: Electromagnetic wave shielding film
20: Electroconductive adhesive layer
21: Electroconductive particle
21a: High melting point electroconductive particle
21a$_1$: High melting point flaky particle
21a$_2$: High melting point spherical particle
21b: Low melting point electroconductive particle
22: Adhesive resin composition
30: Insulating layer
40: Metal layer
50: Printed wiring board
50': Printed wiring board for measuring connection resistance value
51: Base film
52: Printed circuit
52a: Ground circuit
53: Coverlay
53a: Opening
60: Shielded printed wiring board
70: Resistor
80: Electromagnetic wave shielding effect measuring apparatus
83: Measurement jig
84: Central conductor
91: Spectrum analyzer
92, 93: Attenuator
94: Preamplifier

The invention claimed is:
1. An electromagnetic wave shielding film comprising:
an electroconductive adhesive layer comprising electroconductive particles and an adhesive resin composition; and
an insulating layer layered on the electroconductive adhesive layer,
the electroconductive particles comprising high melting point electroconductive particles and low melting point electroconductive particles having a lower melting point than the high melting point electroconductive particles, the high melting point electroconductive particles comprising high melting point flaky particles and high melting point spherical particles, a content of the high melting point flaky particles being 60 to 80% by weight of the total content of the high melting point flaky particles, the high melting point spherical particles, and the low melting point electroconductive particles.

2. The electromagnetic wave shielding film according to claim 1, further comprising a metal layer between the insulating layer and the electroconductive adhesive layer.

3. The electromagnetic wave shielding film according to claim 1, wherein a weight ratio of the high melting point spherical particles to the low melting point electroconductive particles, [high melting point spherical particles]/[low melting point electroconductive particles], is 0.5 to 29.

4. The electromagnetic wave shielding film according to claim 1, wherein the electroconductive adhesive layer further comprises flux, and a content of the flux in the electroconductive adhesive layer is less than 4% by weight.

5. The electromagnetic wave shielding film according to claim 1, wherein the low melting point electroconductive particles have a melting point of 120° C. to 190° C.

6. The electromagnetic wave shielding film according to claim 1, wherein the high melting point electroconductive particles have a melting point of 300° C. to 1500° C.

7. A shielded printed wiring board, comprising:
    a printed wiring board including a base film, a printed circuit arranged on the base film, and a coverlay arranged so as to cover the printed circuit; and
    an electromagnetic wave shielding film including:
        an electroconductive adhesive layer containing electroconductive particles and an adhesive resin composition; and
        an insulating layer layered on the electroconductive adhesive layer,
    the electromagnetic wave shielding film being arranged on the printed wiring board such that the electroconductive adhesive layer is in contact with the coverlay,
    the electroconductive particles including high melting point electroconductive particles and low melting point electroconductive particles having a lower melting point than the high melting point electroconductive particles,
    the high melting point electroconductive particles including high melting point flaky particles and high melting point spherical particles,
    a content of the high melting point flaky particles being 60 to 80% by weight of the total content of the high melting point flaky particles, the high melting point spherical particles, and
    the low melting point electroconductive particles.

8. The shielded printed wiring board according to claim 7, wherein the electromagnetic wave shielding film comprises a metal layer between the insulating layer and the electroconductive adhesive layer.

9. The shielded printed wiring board according to claim 7, wherein the printed circuit comprises a ground circuit,
    the coverlay has an opening formed therein for exposing the ground circuit, and
    the electroconductive adhesive layer fills the opening and is contact with the ground circuit.

* * * * *